United States Patent [19]

Morrison et al.

[11] 4,193,066

[45] Mar. 11, 1980

[54] AUTOMATIC BIAS ADJUSTMENT CIRCUIT FOR A SUCCESSIVE RANGED ANALOG/DIGITAL CONVERTER

[75] Inventors: Steven Morrison; Thomas K. Lisle, Jr.; Clarence C. Glover, all of Baltimore, Md.

[73] Assignee: The United States of America as represented by the Secretary of the Air Force, Washington, D.C.

[21] Appl. No.: 898,047

[22] Filed: Apr. 20, 1978

[51] Int. Cl.$^2$ .................... H03K 13/02

[52] U.S. Cl. .................... 340/347 CC; 340/347 AD

[58] Field of Search .................... 340/347 AD, 347 CC, 340/347 M; 235/310

[56] References Cited

U.S. PATENT DOCUMENTS

| | | | |
|---|---|---|---|
| 3,501,625 | 3/1970 | Gorbatenko | 235/310 |
| 3,646,586 | 2/1972 | Kurz | 340/347 AD |
| 3,754,232 | 8/1973 | Gut | 340/347 CC |
| 3,786,491 | 1/1974 | Carleton | 340/347 CC |
| 3,889,255 | 6/1975 | Pettersen | 340/347 CC |

*Primary Examiner*—Charles D. Miller

*Attorney, Agent, or Firm*—Joseph E. Rusz; Willard R. Matthews, Jr.

[57] ABSTRACT

An automatic bias adjustment circuit for a successive ranged analog/digital converter (SRADC) that eliminates the need for manual bias adjustments and calibration inputs. The bias correction circuit comprehends dual flip flops that are triggered by selected comparators of the SRADC n bit parallel analog/digital converter. The flip flop output signals control up/down counters whose output bits drive digital/analog converter. The digital/analog converted signals are introduced back into the SRADC analog chain to zero bias errors in a particular sub-range. A disabling circuit prevents operation of the bias adjustment circuits for the first sub-range.

2 Claims, 3 Drawing Figures

UP/DOWN COUNTER
21
D/A
23
CORRECTION1
UP/DOWN COUNTER
22
D/A
24
CORRECTION2
UP/DOWN1
ENABLE1
UP/DOWN2
ENABLE2
Q1
Q2
D1
D2
CK2
19
Q1
Q2
D1
D2
CK3
18
Q
D
CK1
20
DIS
SIX
17
16
15
DIS
SIX
TWO
SEVEN
ONE

AUTOMATIC BIAS ADJUSTMENT CIRCUIT FOR A SUCCESSIVE RANGED ANALOG/DIGITAL CONVERTER

BACKGROUND OF THE INVENTION

This invention relates to successive ranged analog/digital converter and in particular to circuits for automatically adjusting for bias errors that are introduced into the analog chain of such devices by the use of high speed amplifiers, hot carrier diode switches and the like.

In a successively ranged analog/digital converter several bits are converted at a time in order to increase the speed over that of a successive approximation analog/digital converter which converts one bit at a time. In the SRADC type of device analog input signals are processed through an analog chain and fed to an n bit parallel analog/digital converter. The analog chain is the portion of the SRADC that determines the maximum operating speed. In order to reduce the propagation time through the analog chain the highest speed amplifiers available are utilized and hot carrier diode switches are used for gain switching. Also the amplifiers are operated over as low an output voltage swing as is feasible. These measures tend to increase bias errors, however. Hot carrier diode switches inherently produce bias errors, high speed amplifiers do not necessarily have good d.c. characteristics and the ratio of output offset to true signal is increased.

The input to the n bit parallel analog/digital converter goes through its range of possible voltage levels in every sub-range as the analog input goes through its full dynamic range. Bias errors in the analog chain can produce saturation of the analog/digital converter in some sub-ranges for a given analog input. This produces discontinuities in the final analog/digital converter output. Accordingly, there currently exists the need for automatic bias correction circuits that obviate the adverse effects of the foregoing enumerated source of bias error. The present invention is directed toward satisfying that need.

SUMMARY OF THE INVENTION

The device to which the invention applies is a successive ranged analog/digital converter (SRADC) in which an analog input is applied to a switchable gain amplifier chain (analog) the output of which is supplied to an n bit parallel analog/digital converter. The n bit parallel analog/digital converter includes a comparator bank whose output taps provide logic functions that define the various ranges of the SRADC. The circuit of the invention comprises a logic circuit that selects appropriate logic functions and applies them to dual flip flop circuits which in turn enable and effect counting in up/down counters. The up/down counters drive digital/analog converters which provide bias correction of bias errors for the particular sub-range the circuit is monitoring. The invention also includes disabling means for preventing operation in the first sub-range of the SRADC.

It is a principal object of the invention to provide a new and improved bias error correction circuit for use in successive ranged analog/digital converters.

It is another object of the invention to provide means for correcting bias errors in a successive ranged analog/digital converter that does not require the use of manual bias adjustments.

It is another object of the invention to provide means for correcting bias errors in a successive ranged analog/digital converter that does not interrupt normal operation of the system nor require the use of calibration inputs.

These together with other objects, features and advantages of the invention will become more readily apparent from the following detailed description when taken in conjunction with the illustrative embodiment in the accompanying drawings.

DETAILED DESCRIPTION OF THE PREFERRED EMBODIMENT

Figure 1:
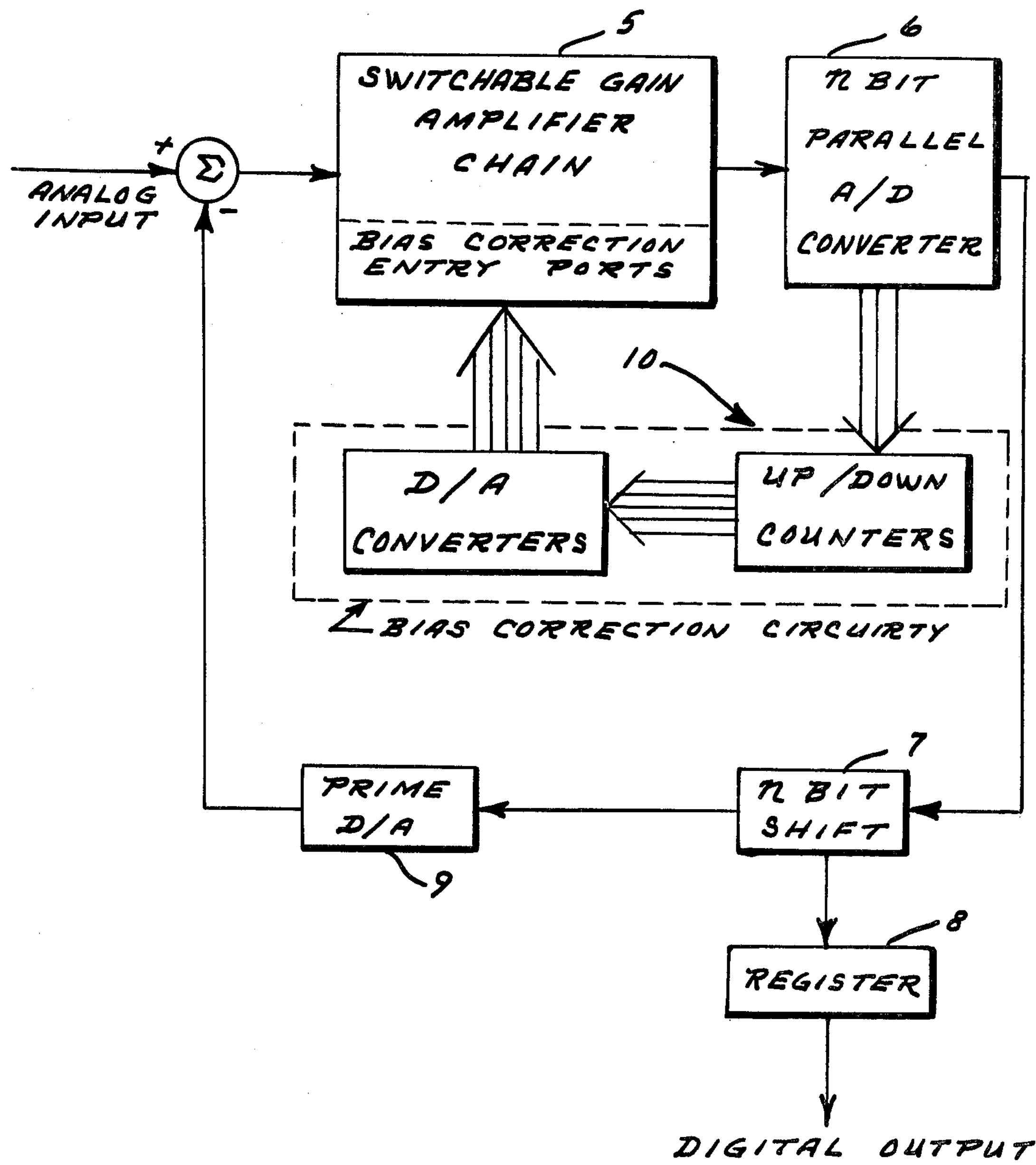
FIG. 1 is a block diagram of a successive ranged analog/digital converter including the bias correction circuit of the invention.

Referring to the block diagram of FIG. 1 the successive ranged analog/digital converter to which the invention applies comprises the analog switchable gain amplifier chain 5, n bit parallel analog/digital converter 6, n bit shift 7, register 8, prime digital/analog converter 9 and summing means 11. This device is described in detail in U.S. Pat. No. 3,956,746 issued May 11, 1976 to Thomas K. Lisle et al entitled SUCCESSIVELY RANGED A/D CONVERTER WITH ERROR CORRECTION. The bias correction circuitry which comprises the invention is fed from the comparator circuit of n bit parallel analog/digital converter 6 and supplies its bias correction signals to switchable gain amplifier chain 5 as hereinafter described.

Operation of the successive ranged analog/digital converter is as follows: The output from n bit parallel analog/digital converter 6 is loaded into successively lower order bits of register 8 which addresses the Prime digital/analog Converter 9. In a given sub-range the Prime digital/analog converter output is subtracted from the analog input by summing means 11 and amplified by the analog chain of switchable gain amplifier chain 5. The gain of this analog chain increases by $2^n$ for each succeeding subrange. The output from the analog chain is analog to digital converted to generate the next n bits of the final analog/digital output.

Figure 2:
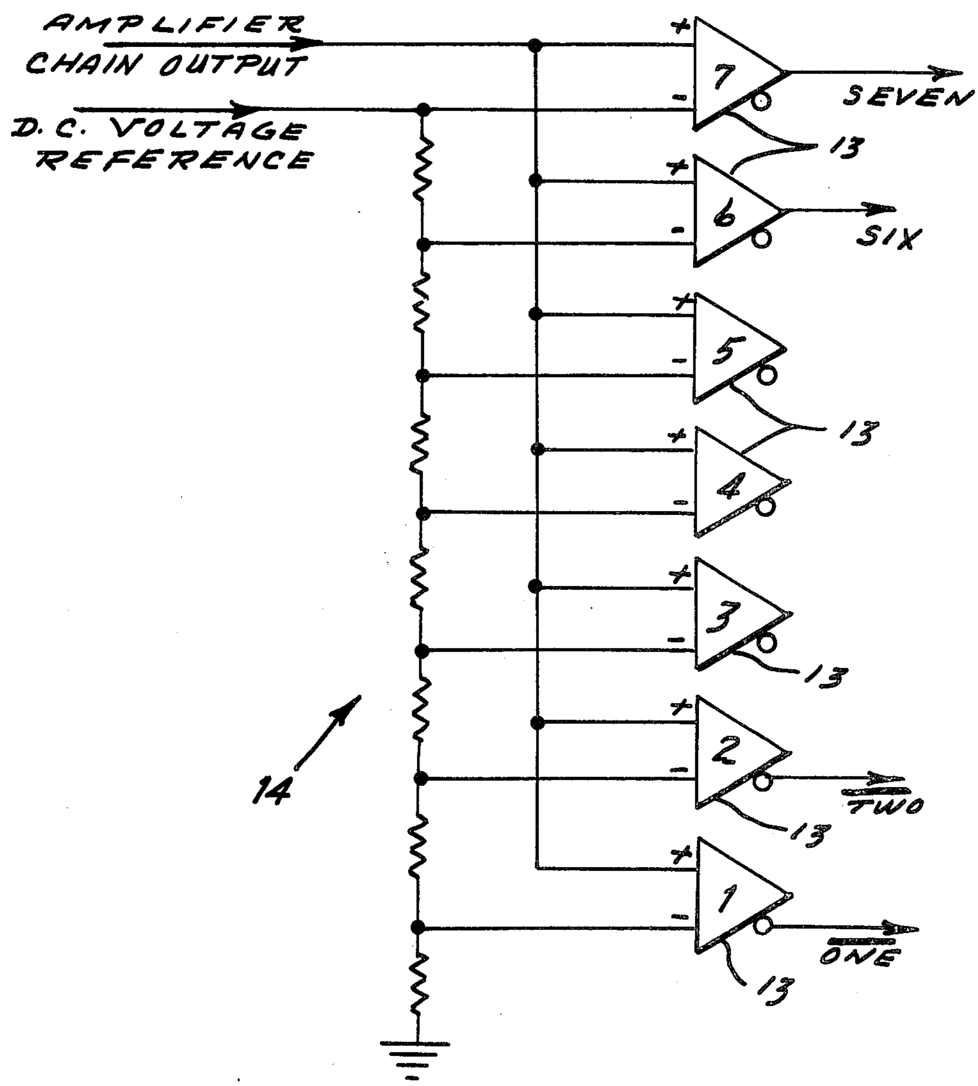
FIG. 2 is a schematic drawing of the comparator network of the n bit parallel analog/digital converter of FIG. 1.

The n-bit parallel analog/digital converter 6 contains $2^{n-1}$ comparators. FIG. 2 is a schematic diagram of the comparator network. The input signal is applied directly to the non-inverting inputs of every comparator 13. The inverting inputs of the comparators are connected to taps of a linear voltage divider 14 connected between ground and a voltage reference. Thus as the input to the analog/digital converter traverses its range from minimun to maximum, the comparator outputs progress from all "zero" logic state outputs to all ones in a linear fashion.

Figure 3:
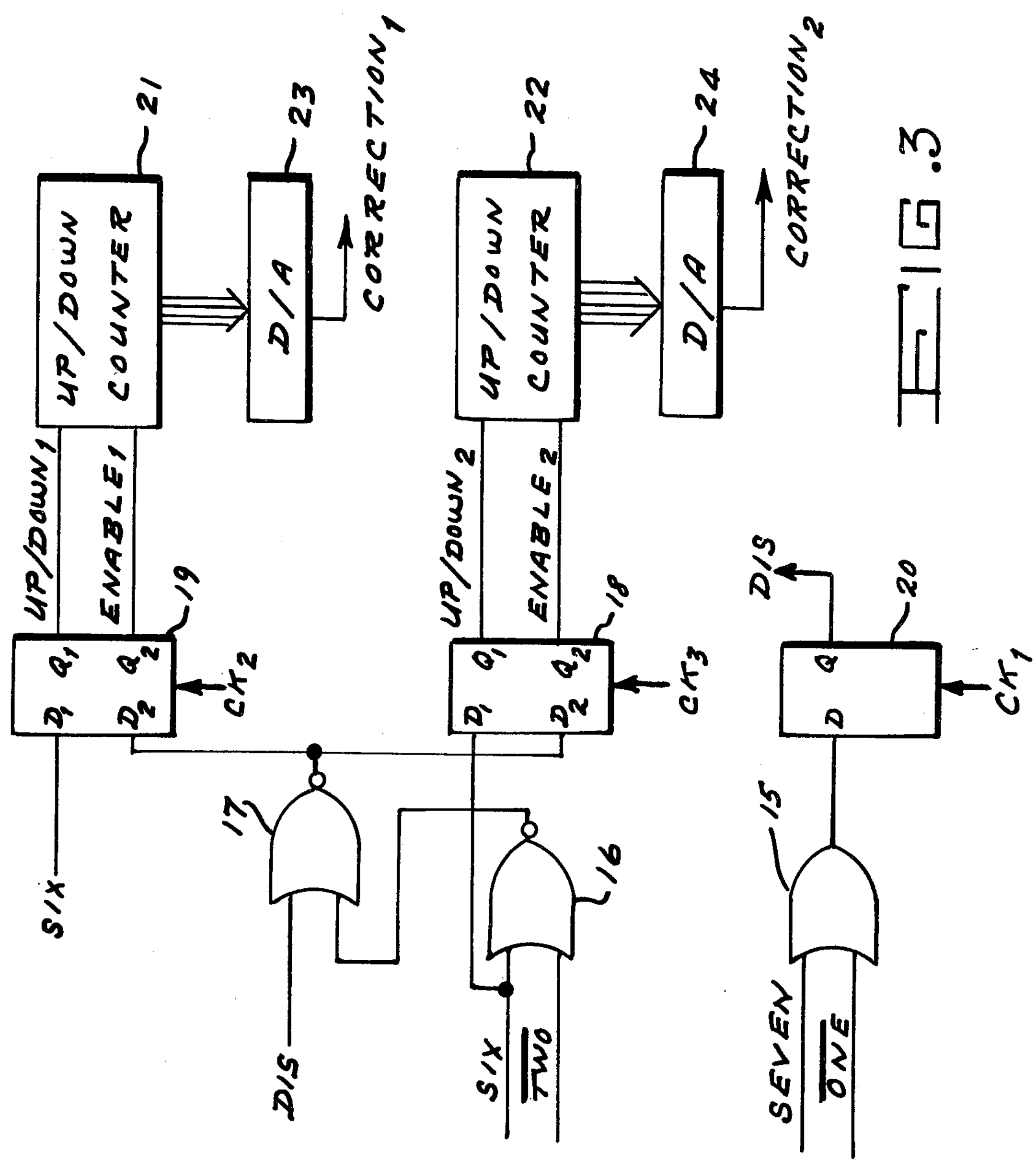
FIG. 3 is a schematic diagram of the bias correction circuit of the invention.

FIG. 3 is a simplified diagram of one possible circuit which mechanizes the invention. It comprises OR gate 15, NOR gates 16, 17, flip flop 20, dual flip flops 18, 19, up/down counters 21, 22 and digital/analog converters 23, 34. Operation of the circuit is as follows: At the end of the first subrange the function SEVEN+ONE is strobed by clock CK1 into a flip-flop 20. The output from this flip flop (DIS) will disable the operation of the corrective circuitry. That is, during the first subrange, when the most significant bits are generated, the corrective circuitry is disabled because saturation in this range (7<INPUT<1) means that the analog input has exceeded its dynamic range. Clock CK2 strobes the function SIX+TWO (if DIS=0) and SIX into dual flip-flop 19. If the strobed function SIX+TWO=ENABLE 1 is equal to a logic one then corrective action must occur and ENABLE 1 enables up down counter 21 whose output bits drive digital/analog converter 23. The direction of the counter (UP or DOWN) is determined by SIX at the time of CK2. If SIX is a logic one then the counter must count up. The signal CORRECTION 1 out of digital/analog converter 23 is applied to the SRADC analog chain at a point where it will have the most effect for correcting bias errors in that subrange. The action in the next subrange is identical to that in the subrange hereinabove described so that this scheme can be extended to any number of subranges as is desired.

While the invention has been discribed in terms of one presently preferred embodiment it is understood that the words which have been used are words of description rather than words of limitation and that changes within the purview of the appended claims may be made without departing from the scope and spirit of the invention in its broader aspects.

What is claimed:

1. In a successive ranged analog/digital converter having a switchable gain amplifier chain and an n bit parallel analog/digital converter, the improvement of an automatic bias adjustment circuit, said automatic bias adjustment circuit comprising up/down counter means, digital/analog converter means driven by said up/down counter means and providing bias correction signals in response thereto, said bias correction signals being fed to said switchable gain amplifier chain, a logic circuit for developing from said n bit parallel analog/digital converter first and second logic functions, said logic functions defining a given sub-range, up/down counter actuating means receiving said first and second logic functions and clock signals, said actuating means enabling said up/down counter means in response to said first logic function and effecting counting thereby in a direction dictated by the state of said second logic function, disabling means for disabling said up/down counter actuating means in response to logic functions defining the first sub-range of said successive ranged analog/digital converter, said disabling means comprising a dual input OR gate connected to receive logic function inputs from said n bit parallel analog/digital converter, and a flip flop circuit receiving the output of said OR gate and a clock signal and providing an output disabling signal in response thereto.

2. An automatic bias adjustment circuit as defined in claim 1 wherein said up/down counter means comprises first an second up/down counters, said digital/analog converter means comprises a first digital/analog converter connected to receive the output of said first up/down counter and a second digital/analog converter connected to receive the output of said second up/down counter, said up/down counter actuating means comprises a first dual flip flop circuit having first and second outputs connected to said first up/down counter and a first input connected to receive logic function inputs from said n bit parallel analog/digital converter and a second dual flip flop circuit having first and second outputs connected to said second up/down counter and a first input connected to receive logic functions from said n bit parallel analog/digital converter, and said logic circuit comprises first and second dual input NOR gates, said first NOR gate having one input connected to the output of said disabling means, the other input connected to the output of said second NOR gate and its output connected to the second inputs of said dual flip flop circuits, and said second NOR gate having its inputs connected to receive logic function input signals from said n bit parallel analog/digital converter.

* * * * *